US010858259B2

(12) United States Patent
Kurosawa et al.

(10) Patent No.: US 10,858,259 B2
(45) Date of Patent: Dec. 8, 2020

(54) REACTOR FOR POLYCRYSTALLINE SILICON PRODUCTION AND METHOD FOR PRODUCING POLYCRYSTALLINE SILICON

(71) Applicant: SHIN-ETSU CHEMICAL CO., LTD., Tokyo (JP)

(72) Inventors: Yasushi Kurosawa, Niigata (JP); Shigeyoshi Netsu, Niigata (JP); Naruhiro Hoshino, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 236 days.

(21) Appl. No.: 15/741,356

(22) PCT Filed: Jul. 25, 2016

(86) PCT No.: PCT/JP2016/071674
§ 371 (c)(1),
(2) Date: Jan. 2, 2018

(87) PCT Pub. No.: WO2017/018366
PCT Pub. Date: Feb. 2, 2017

(65) Prior Publication Data
US 2019/0002295 A1 Jan. 3, 2019

(30) Foreign Application Priority Data
Jul. 28, 2015 (JP) ................. 2015-148989

(51) Int. Cl.
*C23C 16/24* (2006.01)
*C01B 33/035* (2006.01)
(52) U.S. Cl.
CPC ............ *C01B 33/035* (2013.01); *C23C 16/24* (2013.01)
(58) Field of Classification Search
CPC ........ C01B 33/00; C01B 33/035; C23C 16/24
See application file for complete search history.

(56) References Cited

U.S. PATENT DOCUMENTS

| | | | |
|---|---|---|---|
| 4,173,944 A | * 11/1979 | Koppl | ................... C01B 33/035 118/719 |
| 4,179,530 A | 12/1979 | Koppl et al. | |

(Continued)

FOREIGN PATENT DOCUMENTS

| | | | |
|---|---|---|---|
| JP | 5-206043 A | 8/1993 |
| JP | 9-241099 A | 9/1997 |

(Continued)

OTHER PUBLICATIONS

Office Action dated Mar. 13, 2018, issued in counterpart Japanese Application No. 2015-148989, with English machine translation. (4 pages).

(Continued)

*Primary Examiner* — Smita S Patel
(74) *Attorney, Agent, or Firm* — Westerman, Hattori, Daniels & Adrian, LLP

(57) ABSTRACT

A reactor 200 according to the present invention includes a heater storage section serving as a space section capable of accommodating a carbon heater to initial heating of silicon core wires. A carbon heater 13 is loaded in a deposition reaction space 20 in the reactor 200 only when necessary for initial heating of silicon core wires 12. After initial heating of the silicon core wires 12 is finished, the carbon heater 13 is unloaded from the deposition reaction space to the heater storage section 30. As a result, the carbon heater 13 is not unduly damaged in the reactor any longer and its deterioration is reduced. In addition, because of reduction in reaction with hydrogen gas in the reactor, the generation of methane is reduced, and thus carbon contamination of polycrystalline silicon is reduced.

3 Claims, 4 Drawing Sheets

(56) References Cited

U.S. PATENT DOCUMENTS

| | | | |
|---|---|---|---|
| 5,662,469 | A | 9/1997 | Okase et al. |
| 5,895,594 | A | 4/1999 | Fuchs |
| 5,976,481 | A | 11/1999 | Kubota et al. |
| 6,503,563 | B1 | 1/2003 | Yatsurugi et al. |
| 9,209,009 | B2 | 12/2015 | Traunspurger et al. |
| 9,355,918 | B2 | 5/2016 | Funazaki et al. |
| 9,776,876 | B2 | 10/2017 | Traunspurger et al. |
| 2009/0263578 | A1* | 10/2009 | Lindfors ............. C23C 16/4485 427/248.1 |
| 2011/0014468 | A1 | 1/2011 | Urushihara et al. |

FOREIGN PATENT DOCUMENTS

| | | |
|---|---|---|
| JP | 2001-278611 A | 10/2001 |
| JP | 2003-119015 A | 4/2003 |
| JP | 2006-206387 A | 8/2006 |
| JP | 2011-37699 A | 2/2011 |
| JP | 2013-71856 A | 4/2013 |
| JP | 2013-170122 A | 9/2013 |
| JP | 2013-256431 A | 12/2013 |
| WO | 97/44277 A1 | 11/1997 |

OTHER PUBLICATIONS

International Search Report dated Sep. 20, 2016, issued in Counterpart of International Application No. PCT/JP2016/071674 (4 pges) w/English Translation.
Office Action dated Oct. 1, 2019, issued in counterpart JP application No. 2018-096778, with English translation. (10 pages).

\* cited by examiner

REACTOR FOR POLYCRYSTALLINE SILICON PRODUCTION AND METHOD FOR PRODUCING POLYCRYSTALLINE SILICON

TECHNICAL FIELD

The present invention relates to relates to a technique for producing polycrystalline silicon, more specifically to a technique suitable for reducing the concentration of carbon contained in polycrystalline silicon produced by a Siemens method.

BACKGROUND ART

Polycrystalline silicon is a raw material for single-crystal silicon substrates for producing semiconductor devices or substrates for producing a solar cell. In general, polycrystalline silicon is produced by a Siemens method, in which a source gas containing chlorosilane is brought into contact with a heated silicon core wire to thereby chemically vapor-deposit (CVD) polycrystalline silicon onto the surface of the silicon core wire.

When polycrystalline silicon is chemically vapor-deposited by the Siemens method, two silicon core wires in the vertical direction and one silicon core wire in the horizontal direction are assembled into a shrine-gate shape (inverted U shape) in a reactor. Both the ends of this shrine-gate shaped silicon core wire are each fixed to each of metal electrodes placed on a base plate by means of each of carbon core wire holders. Then, shrine-gate-shaped silicon core wires described above are heated by applying current through the silicon core wire from these metal electrodes. Usually, a plurality of shrine-gate-shaped silicon core wires are disposed on the base plate. Such a core wire holder may be fixed directly on an electrode, but, in order to prevent damage on the electrode, a carbon adapter may be provided between the electrode and the core wire holder (see Patent Literature 1: Japanese Patent Laid-Open No. 2006-205387, Patent Literature 2: Japanese Patent Laid-Open No. 2013-71856, and the like).

In the reactor, a sealed space formed by the aforementioned base plate and a dome-shaped vessel (bell jar) is used as a reaction space for chemically vapor-deposit polycrystalline silicon. The metal electrodes penetrate the base plate with an insulator sandwiched between the electrodes and are connected via wiring either to another metal electrode or to a power supply provided outside the reactor. In the case of chemical vapor deposition of polycrystalline silicon in the reaction space, for the purpose of preventing polycrystalline silicon from depositing onto portions other than the shrine-gate-shaped silicon core structures and of preventing damage due to high temperature of apparatus materials, the metal electrodes, base plate, and bell jar are cooled with coolant such as water and oil. The core wire holders are cooled via the metal electrodes.

The reactor is purged with hydrogen. While the silicon core wires are heated to the temperature range of 900° C. or more and 1200° C. or less by applying current through the core wires from the metal electrodes described above, source gas is supplied from gas nozzles into the reactor. Then, silicon is chemical vapor-deposited onto the silicon core wires to form polycrystalline silicon having a desired diameter in inverted U shapes. As the source gas, mixed gas of trichlorosilane and hydrogen is used, for example. As the reaction pressure in the reactor during the deposition step of polycrystalline silicon, a pressure of 0.1 MPa to 0.9 MPa is commonly selected. After the deposition step of polycrystalline silicon is finished, the reactor is cooled and then opened to air, and the polycrystalline silicon is removed from the reactor.

Incidentally, silicon core wires are produced with polycrystalline silicon, monocrystalline silicon or the like. Silicon core wires used for producing highly-pure polycrystalline silicon are required to be highly pure core wires having a low impurity concentration, specifically, required to be core wires having a high specific resistance of 500 Ωcm or more. For applying current through such highly resistant silicon core wires, an extremely high voltage is required because the specific resistance is commonly high (conductivity is low) at normal temperature. Thus, it is common to use a core having a low specific resistance to apply current or to begin to apply current after the specific resistance is reduced (conductivity is increased) by initially heating the silicon core wires to 200 to 400° C. in advance.

For such initial heating, a carbon heater is provided in the center or on the inner peripheral face of the reactor. At the beginning of the reaction, the carbon heater is first allowed to generate heat by applying current therethrough. Radiation heat generated in this case heats silicon core wires placed around the carbon heater to a desired temperature (see Patent Literature 3, for example).

Once application of current through the silicon core wires is started, deposition reaction continuously proceeds because the surface temperature is maintained by heat generation of the silicon core wires themselves, even if heating by the carbon heater is discontinued thereafter. Thus, after application of current through the aforementioned silicon core wires is started, the power supply of the carbon heater is turned off.

Thereafter, in the reaction step, deposition of polycrystalline silicon onto the silicon core wires is continued. The carbon heater for heating remains in the reactor as is after its role of initial heating is finished. Accordingly, the carbon heater for heating is exposed to a severe environment (high-temperature and high-speed gas flow) in the reactor although the reactor is no longer used for the reaction, and deteriorates severely. The heater deteriorates after a single use (one batch of deposition reaction) in many cases. It is difficult to use the heater for a plurality of times, which is one factor to increase the cost of polycrystalline silicon production.

In addition, the carbon heater for heating remains left in the deposition space of polycrystalline silicon, and thus, the heater may become a source of carbon contamination of polycrystalline silicon to be deposited. Particularly in a reactor designed for highly-effective deposition reaction, there is a problem in that carbon contamination from the carbon heater for heating is likely to occur because deposition reaction proceeds at high pressure and high temperature.

In view of such a problem, a method has been devised including heating silicon core wires by an infrared irradiation means instead of a carbon heater for heating. This method, which is a method for heating from the outside of the reactor, has for example the following drawbacks: use of a special and expensive apparatus is required (Patent Literature 4: Japanese Patent Laid-Open No. 9-241099); and a portion of the wall of the reactor is required to be produced with transparent quartz having strength lower than that of steel (Patent Literature 5: Japanese Patent Laid-Open No. 2001-278611). Problematically, this is not preferable for safety reasons as a reactor for carrying out reaction under a high pressure.

CITATION LIST

Patent Literature

Patent Literature 1
   Japanese Patent Laid-Open No. 2006-206387
Patent Literature 2
   Japanese Patent Laid-Open No. 2013-71856
Patent Literature 3
   Japanese Patent Laid-Open No. 2011-37699
Patent Literature 4
   Japanese Patent Laid-Open No. 9-241099
Patent Literature 5
   Japanese Patent Laid-Open No. 2001-278611
Patent Literature 6
   U.S. Pat. No. 4,179,530

SUMMARY OF INVENTION

Problems to be Solved by the Invention

The present invention has prepared in the view of such a problem, and it is an object of the present invention to provide a technique suitable for reducing carbon contamination from a carbon heater and reducing the concentration of carbon contained in polycrystalline silicon on producing polycrystalline silicon by a Siemens method.

Means for Solving the Problems

In order to solve the aforementioned problem, the reactor for polycrystalline silicon production according to the present invention is a reactor for producing polycrystalline silicon by a Siemens method, including a deposition reaction section as a apace section in which polycrystalline silicon is deposited onto silicon core wires and a heater storage section as a space section capable of accommodating a carbon heater for initial heating of the silicon core wires.

The reactor preferably includes a heater driving section for controlling loading of the carbon heater from the heater storage section to the deposition reaction section and unloading of the heater from the deposition reaction section to the heater storage section.

The reactor also preferably includes an openable and closable shutter for spatially blocking the heater storage section from the deposition reaction section.

For example, the heater storage section is constituted by bellows.

The method for producing polycrystalline silicon according to the present invention is a method for producing polycrystalline silicon by a Siemens method, in which, silicon core wires are initially heated by a carbon heater in advance of a deposition reaction step of polycrystalline silicon, the carbon heater is escaped from a deposition reaction space after the silicon core wires reach a predetermined temperature, and thereafter, the deposition reaction step is started.

Advantageous Effects of Invention

According to the present invention, the level of carbon contamination in polycrystalline silicon produced by the Siemens method can be reduced, and high-quality polycrystalline silicon can be produced at high efficiency.

MODE FOR CARRYING OUT THE INVENTION

A mode for carrying out the invention will be described hereinbelow with reference to the drawings.

Figure 1:
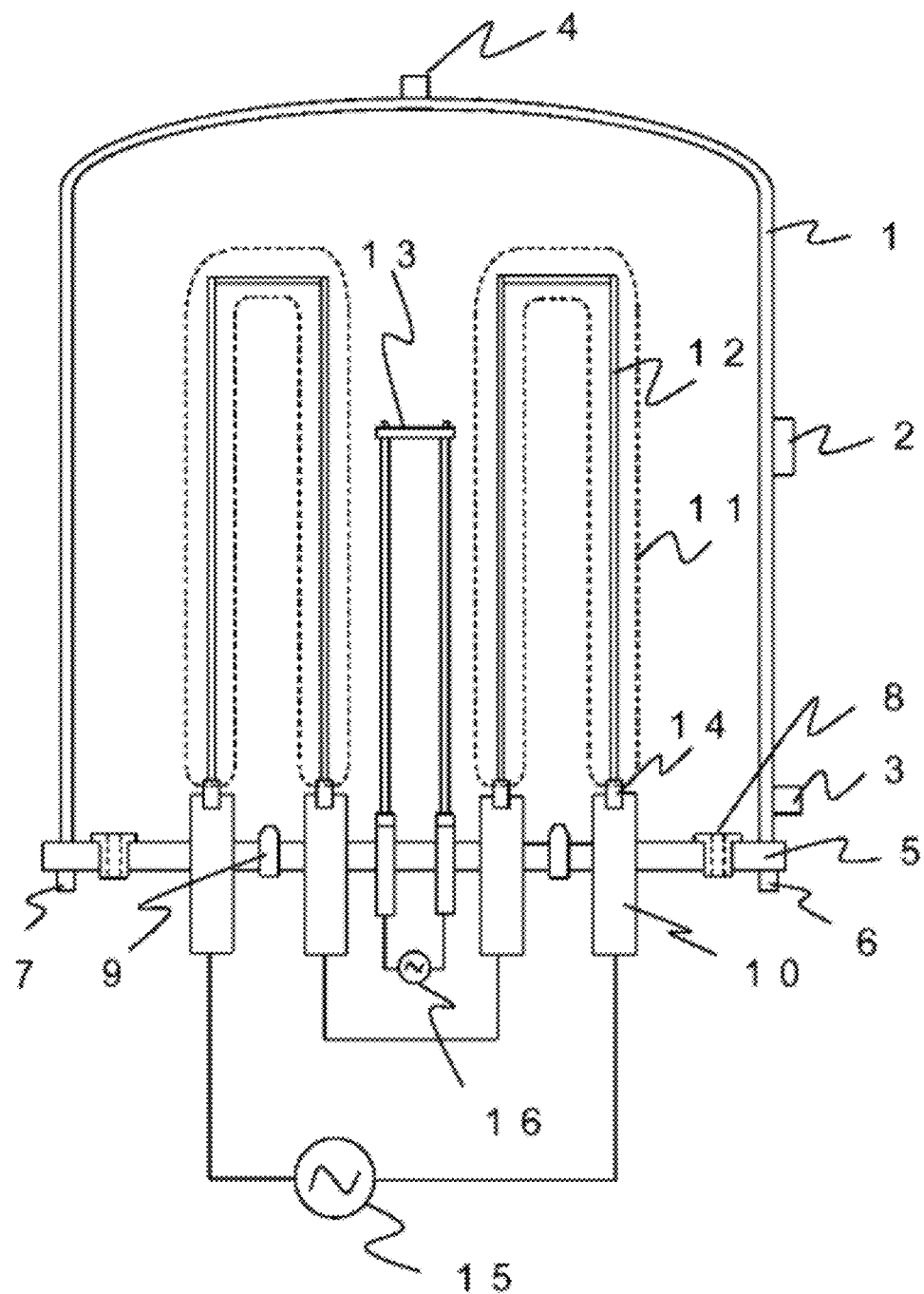
FIG. 1 is a schematic cross-sectional view showing one example of the configuration of a conventional reactor for polycrystalline silicon production.

FIG. 1 is a schematic cross-sectional view showing one example of the configuration of a conventional reactor 200 for polycrystalline silicon production. The reactor 200 is an apparatus for chemically vapor-deposit polycrystalline silicon onto the surface of silicon core wires 12 by a Siemens method to thereby obtain polycrystalline silicon rods 11, including a base plate 5 and a bell jar 1.

On the base plate 5, electrodes for silicon core wires 10 for supplying current to the silicon core wires 12 fixed on adapters 14, source gas supply nozzles 9 for supplying process gas such as nitrogen gas, hydrogen gas, and trichlorosilane gas, and reaction exhaust gas outlets 8 for discharging exhaust gas to the outside are disposed.

A member denoted by the sign 13 in the figure is a carbon heater for initially heating silicon core wires. The carbon heater 13 is electrically heated by current supply from a power supply for a carbon heater 16 at initial heating to thereby initially heat the surface of the silicon core wires 12 to a desired temperature.

The bell jar 1 has an inlet 3 and an outlet 4 for cooling coolant and an observation window 2 for visual check of the state inside the bell jar. The base plate 5 also has an inlet 6 and an outlet 7 for cooling coolant.

In an actual production process of polycrystalline silicon, the reactor is operated in a batch manner. Thus, after one batch is finished, the bell jar 1 is separated from the base plate 5, the polycrystalline silicon rods 11 are removed from inside the reactor, a side reaction product adhering to the surface of the bell jar 1 and the base plate 5 is cleaned off, and silicon core wires 12 for the next batch are set. When the carbon heater for heating 13 severely deteriorates and is not tolerable to the next reaction batch at this point, the carbon heater 13 is replaced by a new one.

After this silicon core wires 12 are set, the bell jar 1 is set on the base plate 5 again, and, first, the inside of the reactor is purged with nitrogen gas. Nitrogen gas is supplied from the source gas supply nozzles 9 into the reactor and the air component is discharged from the reaction exhaust gas outlets 8 to the outside. After this nitrogen gas purge is finished, the supply gas is switched to hydrogen gas, and the inside of the reactor is purged with hydrogen gas.

After the hydrogen gas purge is finished, a test of airtightness inside the reactor is carried out. The pressure inside the reactor at this airtightness test is approximately equivalent to the pressure inside the reactor in the deposition reaction step of polycrystalline silicon (0.4 to 0.9 MPa). The reactor is checked for gas leakage by a technique such as pouring a foaming liquid onto a face at which the bottom face of the bell jar 1 is in contact with the base plate 5 and using a hydrogen gas detector.

After the hydrogen gas airtightness test aforementioned is completed, current application through the carbon heater 13 is started in order to heat the silicon core wires 12. This current application heats the silicon core wires 12. An increase in the temperature of the silicon core wires 12 reduces the electrical specific resistance of the silicon core wires 12, and providing the silicon core wires 12 with a voltage from a power supply for silicon core wires 15 allows current to be applied therethrough.

The silicon core wires 12 that have been placed into an electrically heated state maintain their surface temperature by heat generation by the silicon core wires 12 themselves, even without thermal radiation from the carbon heater for heating 13. Thus, current application through the carbon heater 13 is stopped after the aforementioned initial heating step is completed.

After the initial heating step is completed, chlorosilane gas as the reaction source gas is supplied from nozzles 9 along with hydrogen gas as the carrier gas to thereby start the deposition reaction step of polycrystalline silicon.

In a conventional apparatus having a structure as shown in FIG. 1, the carbon heater 13 for initial heating of silicon core wires remains in the reactor also in this deposition reaction as in the initial heating step. That is, although the carbon heater 13 is no longer used for deposition reaction of polycrystalline silicon, the carbon heater 13 is exposed to a severe environment (high-temperature and high-speed gas flow) such as continuous subjection to radiation heat from polycrystalline silicon in the reactor.

In the reactor, high-speed circulating flow in the reactor is generated by circulating flow caused by thermal convection of reaction gas and gas flow from the gas supply nozzles 9. Thus, the carbon heater 13 is placed into a state where the carbon heater 13 is subjected to gas flow resistance at high temperature and furthermore, attacked by hydrogen gas. As a result, the heater 13 severely deteriorates. In many cases, the carbon heater 13 deteriorates in one batch of deposition reaction, and it is difficult to use the carbon heater 13 for a plurality of times.

Additionally, it is known that such a carbon heater 13 subjected to high temperature reacts with hydrogen gas in the reactor to be a methane ($CH_4$) generating source. This methane gas is captured into depositing polycrystalline silicon to thereby cause carbon contamination.

Moreover, polycrystalline silicon is deposited locally onto the carbon heater 13 in addition to onto the silicon core wires 12. Thus, even if the deterioration is not severe and the heater is reusable, polycrystalline silicon has to be removed in advance of use in the next batch.

Then, the present invention employs a configuration in which only when necessary for initial heating of the silicon core wires 12, the carbon heater 13 is loaded into the deposition reaction space, and after the initial heating of the silicon core wires 12 is finished, the carbon heater 13 is unloaded from the deposition reaction space.

The carbon heater 13, having such a configuration, is not unduly damaged in the reactor any longer. In addition that the deterioration can be reduced, the reaction with hydrogen gas in the reactor is reduced to thereby reduce generation of methane ($CH_4$). Thus, carbon contamination of polycrystalline silicon grown by deposition reaction is also reduced.

Further, no polycrystalline silicon is deposited onto the carbon heater 13, and thus, removal of polycrystalline silicon is not necessary in advance of use in the next batch.

Figure 2A:
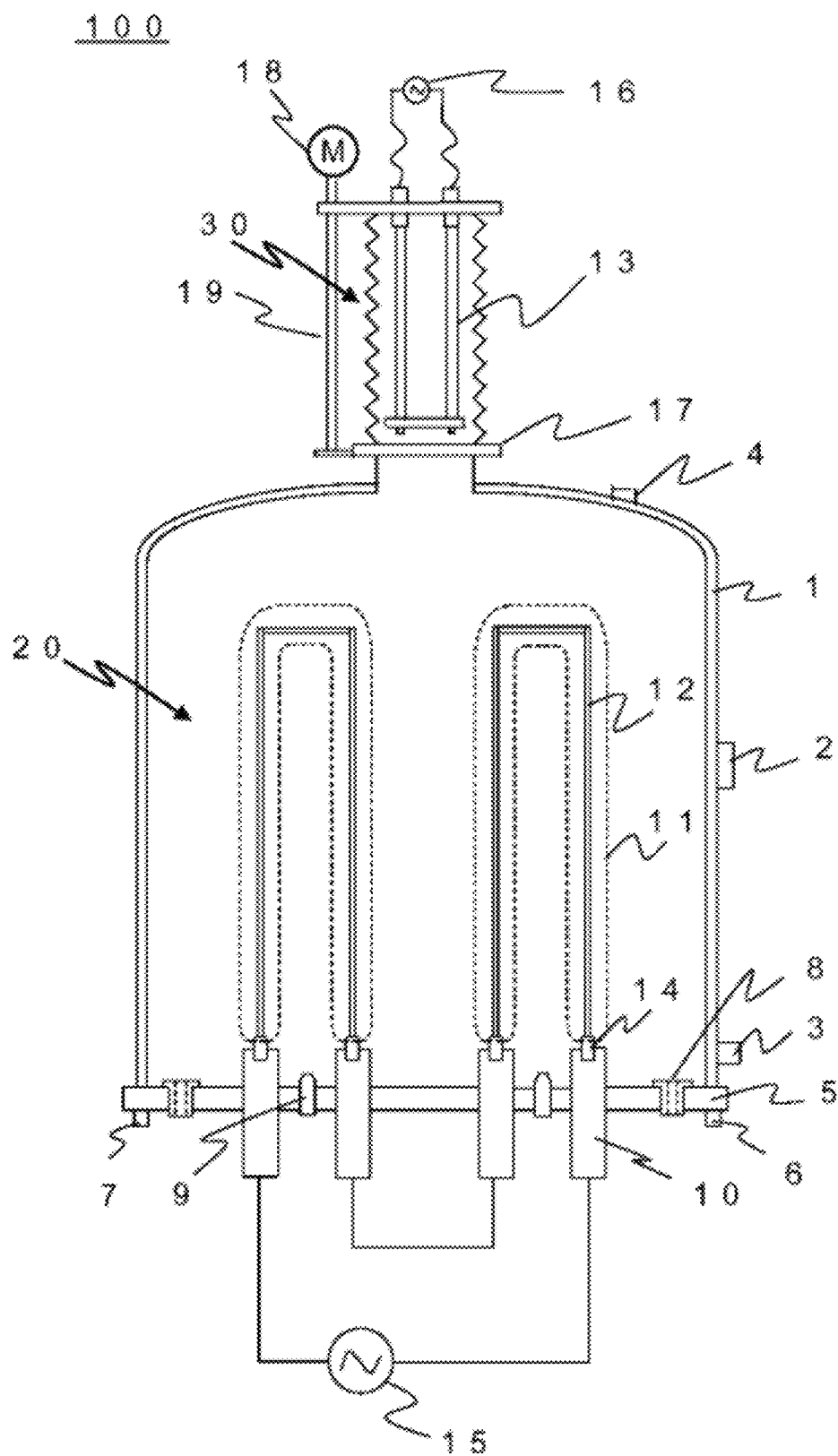
FIG. 2A is a schematic cross-sectional view showing one example of the configuration of a reactor for polycrystalline silicon production according to the present invention, illustrating a state in which a carbon heater is unloaded from a deposition reaction section to a heater storage section.
Figure 2B:
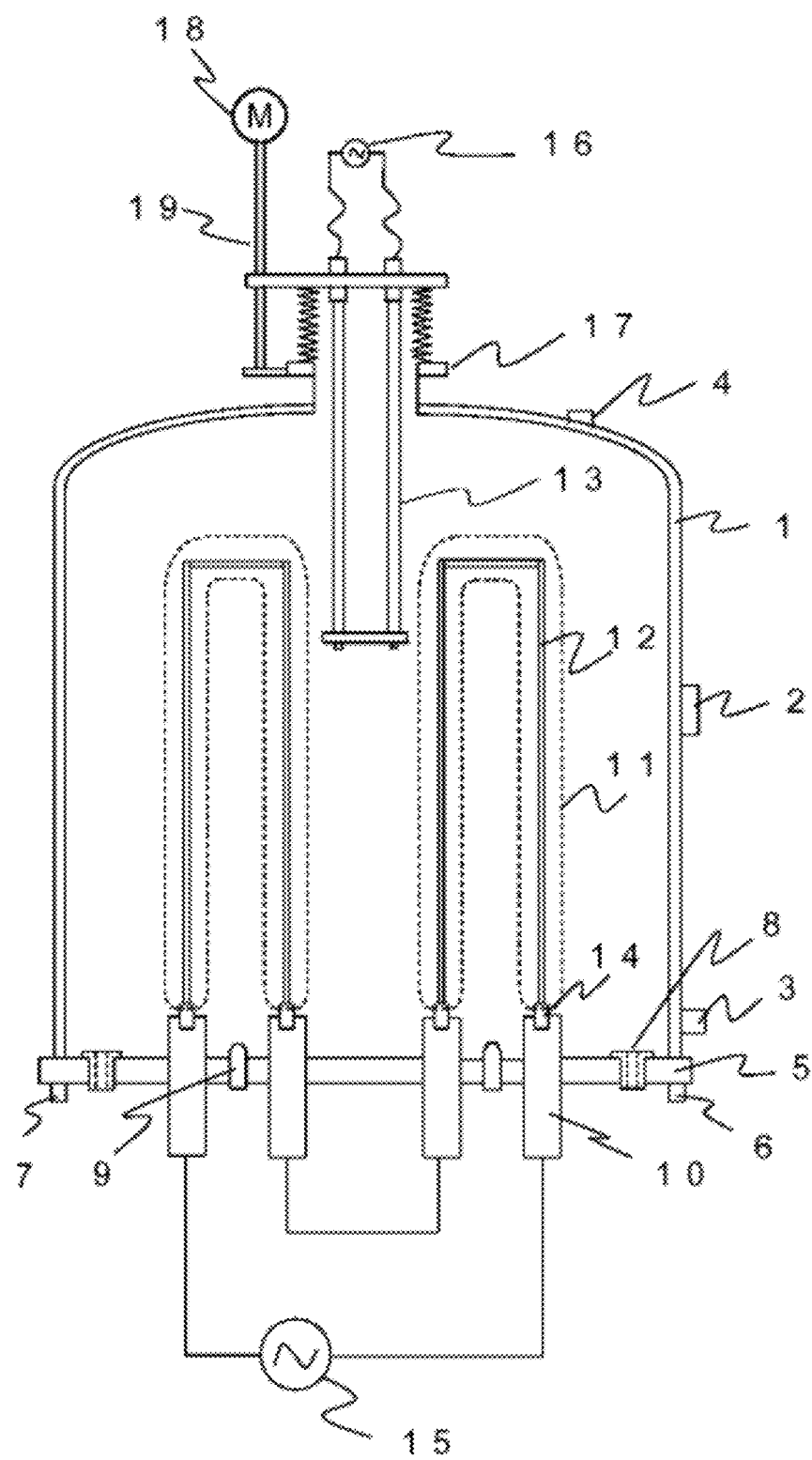
FIG. 2B is a schematic cross-sectional view showing one example of the configuration of a reactor for polycrystalline silicon production according to the present invention, illustrating a state in which the carbon heater is loaded from the heater storage section to the deposition reaction section.

FIGS. 2A to B are schematic cross-sectional views showing one example of the configuration of a reactor for polycrystalline silicon production according to the present invention. FIG. 2A illustrates a state in which a carbon heater is unloaded from a deposition reaction section to a heater storage section, and FIG. 2B illustrates a state in which the carbon heater is loaded from the heater storage section to a deposition reaction section.

This reactor 100 differs from the reactor 200 having the structure shown in FIG. 1 in that the reactor 100 includes a heater storage section as a space section capable of accommodating a carbon heater for initial heating of silicon core wires. In a reactor having such a structure, a carbon heater 13 is loaded in a deposition reaction space 20 only when necessary for initial heating of silicon core wires 12. After initial heating of the silicon core wires 12 is finished, the carbon heater 13 is unloaded from the deposition reaction space to a heater storage section 30.

In these figures, a member denoted by the sign 17 is an openable and closable shutter that may spatially block the heater storage section 30 from the deposition reaction section 20, a member denoted by the sign 18 is a motor for heater driving, and a member denoted by the sign 19 is a ball screw for heater driving. In the example shown in these figures, the heater storage section is constituted by bellows, and the ball screw for heater driving 19 rotated by the motor for heater driving 18 constitutes the heater driving section.

That is, the reactor for polycrystalline silicon production according to the present invention is a reactor for producing polycrystalline silicon by a Siemens method, including a deposition reaction section as a space section in which polycrystalline silicon is deposited onto silicon core wires and a heater storage section as a space section capable of accommodating a carbon heater for initial heating of the silicon core wires.

This reactor includes a heater driving section that controls loading of the carbon heater from the heater storage section to the deposition reaction section and unloading of the heater from the deposition reaction section to the heater storage section, and additionally includes an openable and closable shutter that spatially blocks the heater storage section from the deposition reaction section.

The heater storage section described above is constituted by bellows, for example.

The method for producing polycrystalline silicon using a reactor having such a structure is a method for producing polycrystalline silicon, in which silicon core wires are initially heated by a carbon heater in advance of a deposition reaction step of polycrystalline silicon, the carbon heater is escaped from a deposition reaction space after the silicon core wires reach a predetermined temperature, and thereafter, the deposition reaction step is started.

As a method for solving the problem borne by a reactor having a conventional structure aforementioned, there is known an approach to extracting the carbon heater 13 to the outside of the reactor by opening the top of the reactor after completion of ignition to start the deposition reaction step of polycrystalline silicon (Patent Literature 6: U.S. Pat. No. 4,179,530).

In this method, however, it is not possible to carry out the ignition under a hydrogen atmosphere. Thus, purging the deposition reaction space with an inert gas becomes necessary, and an additional effort in the step is required. In contrast, there arises no necessity to purge the deposition reaction space with an inert gas in the present invention

EXAMPLES

In the present example, in the case where polycrystalline silicon was deposited using a reactor having a structure shown in FIGS. 2A to B, (a) the concentration of methane contained in exhaust gas during reaction and (b) the concentration of carbon contained in grown polycrystalline silicon were measured (Example: batch 1). For comparison, in the case where polycrystalline silicon was grown using a reactor having a conventional structure shown in FIG. 1, (a) the concentration of methane contained in exhaust gas during reaction and (b) the concentration of carbon contained in grown polycrystalline silicon were also measured (Comparative Example: batch 2).

Figure 3:
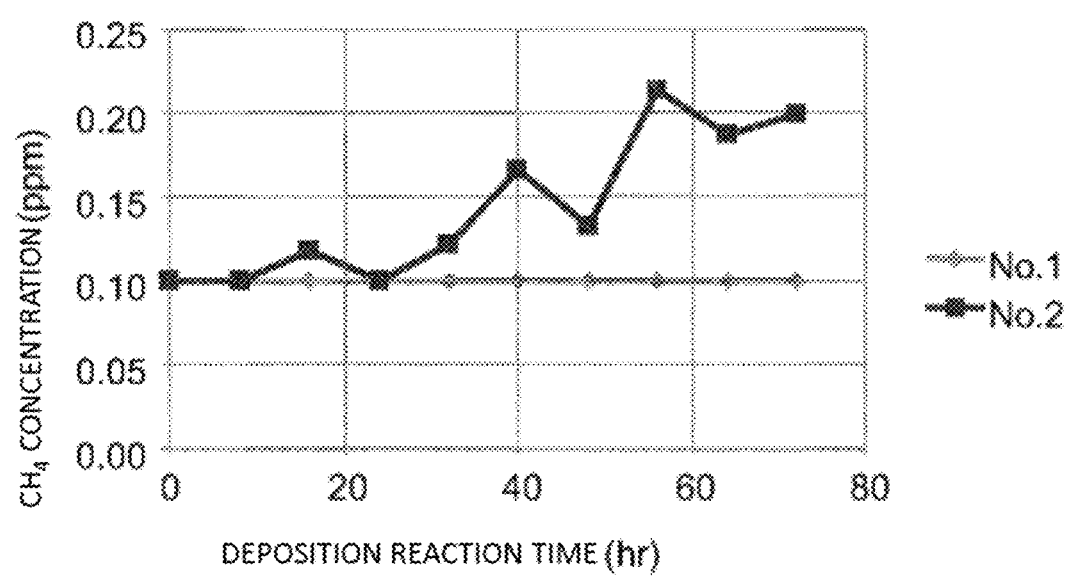
FIG. 3 is a graph showing the deposition reaction time dependency of a $CH_4$ concentration in exhaust gas.

FIG. 3 is a graph showing the deposition reaction time dependency of a $CH_4$ concentration in the exhaust gas. With respect to Example, the methane concentration in the exhaust gas were equivalent to or lower than the lower detection limit (less than 0.100 volppm) through the deposition reaction step (72 hours). In contrast, the $CH_4$ concentration in Comparative Example increases as the deposition reaction step proceeds, and the maximum methane concentration in the exhaust gas reaches 0.213 volppm.

Comparative results of both are summarized in Table 1.

TABLE 1

|  | Example: batch 1 | Comparative Example: batch 2 |
|---|---|---|
| Reaction temperature | 1,160° C. | 1,160° C. |
| Reaction pressure | 0.5 MPa | 0.5 MPa |
| Silane source | Trichlorosilane | Trichlorosilane |
| Final diameter | 121 mmφ | 120 mmφ |
| Reaction time | 72 hours | 72 hours |
| Maximum methane concentration in exhaust gas | Less than 0.100 volppm | 0.213 volppm |
| Carbon concentration in polycrystal | 10 ppba or less | 80 ppba |

According to the results shown in Table 1, in Example, the maximum methane concentration in the exhaust gas is less than 0.100 volppm (equivalent to or lower than the lower detection limit) and the carbon concentration in the polycrystal is 10 ppba or less, whereas, in Comparative Example, the maximum methane concentration in the exhaust gas is 0.213 volppm and the carbon concentration in the polycrystal is 80 ppba. That is, the maximum methane concentration in the exhaust gas is reduced to a half or less of that of Comparative Example. As a result, the carbon concentration in the polycrystal is lowered by one order of magnitude.

INDUSTRIAL APPLICABILITY

The present invention provides a technique suitable for reducing carbon contamination from a carbon heater and reducing the concentration of carbon contained in polycrystalline silicon on producing polycrystalline silicon by a Siemens method.

REFERENCE SIGNS LIST 1 bell jar
2 observation window
3 coolant inlet (bell jar)
4 coolant outlet (bell jar)
5 base plate
6 coolant inlet (base plate)
7 coolant outlet (base plate)
8 reaction exhaust gas outlet
9 source gas supply nozzle
10 electrode for silicon core wire
11 polycrystalline silicon rod
12 silicon core wire
13 carbon heater
14 adapter for silicon core wire
15 power supply for silicon core wire
16 power supply for a carbon heater
17 openable and closable shutter
18 motor for heater driving
19 ball screw for heater driving
20 deposition reaction space
30 heater storage section
100, 200 reactor

The invention claimed is:

1. A reactor for producing polycrystalline silicon by a Siemens method, comprising:
   a deposition reaction section as a space section in which polycrystalline silicon is deposited onto a silicon core wire,
   a heater storage section as a space section capable of accommodating a carbon heater for initial heating of the silicon core wire, and
   a heater driving section for controlling loading of the carbon heater from the heater storage section to the deposition reaction section and unloading of the heater from the deposition reaction section to the heater storage section.

2. The reactor for polycrystalline silicon production according to claim 1, comprising an openable and closable shutter for spatially blocking the heater storage section from the deposition reaction section.

3. The reactor for polycrystalline silicon production according to claim 1, wherein the heater storage section comprises bellows.

* * * * *